(12) United States Patent
Angell et al.

(10) Patent No.: US 6,366,162 B1
(45) Date of Patent: Apr. 2, 2002

(54) MULTI-IMPEDANCE INPUT STAGE

(75) Inventors: Chris W. Angell, Raleigh; Erik L. Bengtsson, Cary; Scott R. Justice, Durham; Aristotele Hadjichristos, Apex, all of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/753,145

(22) Filed: Jan. 2, 2001

(51) Int. Cl.[7] .................................................. G06G 7/26
(52) U.S. Cl. ......................................................... 327/563
(58) Field of Search ................................. 327/560, 561, 327/562, 563

(56) References Cited

U.S. PATENT DOCUMENTS 6,040,732 A * 3/2000 Brokaw ........................ 327/408

* cited by examiner

*Primary Examiner*—Jeffrey Zweizig
(74) *Attorney, Agent, or Firm*—Coats & Bennett, P.L.L.C.

(57) ABSTRACT

An input buffer circuit is operable to selectively present either low or high input impedance while maintaining uniform output impedance. The buffer is characterized by first and second amplifier circuits connected in parallel between an input to and an output from the buffer. The amplifiers are individually controlled between enabled and disabled states. When enabled, the first amplifier has low input impedance and predetermined output impedance and the second amplifier has high input impedance and the predetermined output impedance, and when disabled each amplifier has high input and output impedance. To operate the buffer to have low input impedance, the first amplifier is enabled while the second amplifier is disabled. To operate the buffer to have high input impedance, the second amplifier is enabled while the first amplifier is disabled. When an amplifier is disabled, its input and output impedances are sufficiently large that the disabled amplifier does not interfere with operation of the enabled amplifier.

35 Claims, 7 Drawing Sheets

MULTI-IMPEDANCE INPUT STAGE

BACKGROUND OF THE INVENTION

The present invention relates to input stages for electronic circuits, and in particular to an input buffer circuit that provides selected different input impedances while maintaining the same output properties.

Input buffer circuits are commonly used to isolate a load from a source, for example when driving an signal from an integrated circuit (IC) into a load. The load may comprise another integrated circuit, and normally it is desirable that the buffer circuit have selected input and output impedances. This conventionally is accomplished by specially designing the buffer to have the selected impedances.

An input buffer may be used at an input to an integrated circuit (IC), such as an application specific integrated circuit (ASIC). The ASIC is then a load and an analog signal from an IC source is driven through the buffer into the ASIC. The buffer may be designed to have output impedance as required by an ASIC with which it is to be used. If the ASIC always serves as a load for a particular type of IC source, then the buffer may also be designed to have selected input impedance, usually "low" or "high" input impedance, depending upon the nature of the driver. However, if the ASIC is used with various types of driver circuits and the nature of the driver circuit with which it will be used is not known beforehand, then the buffer usually is designed to have input impedance in accordance with an industry standard. In this case, it may and often does turn out that the industry standard input impedance is not best for connection of the ASIC to any particular driver circuit. In the wireless telephone industry, for example, a buffer may be at an input to an ASIC comprising a phase-locked loop (PLL) receiver circuit, which type of ASIC is driven by various types of sources. Since the nature of a driver circuit to which a buffer will connect a PLL receiver is usually not known ahead of time, a buffer for a PLL receiver is designed to have either low or high input impedance in accordance with an industry standard. For an ASIC comprising a PLL receiver, the industry standard is for an input buffer to have high input impedance, but the industry standard input impedance is often not the best choice for the buffer circuit. For example, if a transceiver drives a radio frequency (RF) signal to the PLL receiver through a buffer circuit, high buffer input impedance does not enhance a desired objective of providing a current efficient and parasitic insensitive way of implementing the RF interface. For this application, the better solution would be to have low buffer input impedance, which as compared with high buffer input impedance would improve current efficiency and insensitivity to parasitics and generally obviate the need for external components such as pull-up resistors.

It would therefore be desirable to provide a buffer circuit for use at an input to an ASIC, the input impedance to which buffer can selectively be controlled to accommodate efficiently connecting the ASIC to various types of driver circuits, while maintaining uniform output properties from the buffer.

SUMMARY OF THE INVENTION

In accordance with the present invention, there is provided a multi-impedance input buffer circuit for driving an analog signal from a source to a load. The buffer circuit includes at least one amplifier circuit having an input for receiving the analog signal from the source and an output for delivering the analog signal to the load. The at least one amplifier is responsive to a first control signal to have low input impedance while coupling the analog signal from the source to the load and is responsive to a second control signal to have high input impedance while coupling the analog signal from the source to the load.

The at least one buffer circuit amplifier may comprise first and second amplifier circuits for delivering the analog signal from the source to the load. The first amplifier circuit has an input for receiving the analog signal from the source, an output for delivering the analog signal to the load, and an impedance control. The first amplifier is responsive to application of the first control signal at its impedance control to be enabled to couple the analog signal from the source to the load and to have low input impedance, and is responsive to absence of the first control signal at its impedance control to be disabled from coupling the analog signal from the source to the load and to have high input impedance. The second amplifier circuit has an input connected to the first amplifier circuit input for receiving the analog signal from the source, an output connected to the first amplifier circuit output for delivering the analog signal to the load, and an impedance control. The second amplifier circuit is responsive to application of a second control signal at its impedance control to be enabled to couple the analog signal from the source to the load and to have high input impedance, and is responsive to absence of the first control signal at its impedance control to be disabled from coupling the analog signal from the source to the load and to have high impedance at its input.

The invention also contemplates a method of operating a buffer circuit for driving an analog signal from a source to a load. The method comprises the steps of coupling the analog signal from the source to an input to the buffer circuit; connecting the output from the buffer circuit to the load; and controlling the buffer circuit to have either low input impedance and determined output impedance or high input impedance and selected output impedance.

The foregoing and other advantages and features of the invention will become apparent upon a consideration of the following detailed description, when taken in conjunction with the accompanying drawings.

DETAILED DESCRIPTION OF THE INVENTION

According to the invention, an input buffer circuit can be enabled to provide selected different input impedances at a single input to the buffer, while maintaining the same output properties. The input buffer circuit is therefore generic in use, in that the ability to control its input impedance enables it to be connected to different types of driver circuits. When used at an input to an application specific integrated circuit (ASIC), the input buffer advantageously enables the ASIC to be connected to various driver circuits having different load impedance requirements.

Figure 1:
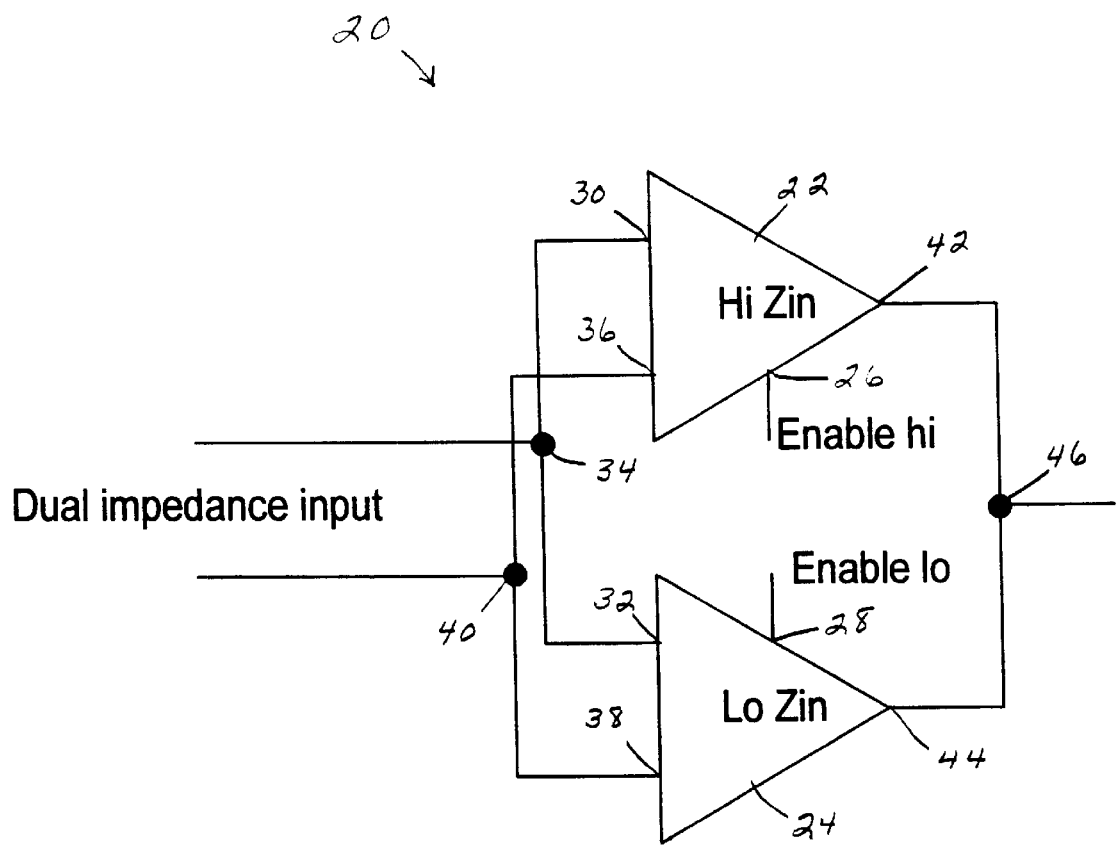
FIG. 1 shows an input buffer circuit embodying the teachings of the present invention.

An input buffer circuit embodying the invention is shown in FIG. 1 and indicated generally at 20. The buffer includes first and second amplifiers 22 and 24 having respective enable inputs 26 and 28. An input 30 to the amplifier 22 and an input 32 to the amplifier 24 connect at a buffer circuit input node 34, an input 36 to the amplifier 22 and an input 38 to the amplifier 24 connect at a buffer circuit input node 40, and an output 42 from the amplifier 22 and an output 44 from the amplifier 24 connect at a buffer circuit output node 46. In operation of the buffer circuit, at any one time an enable signal is applied to only one or the other of the enable inputs 26 and 28 of the amplifiers 22 and 24. In response to an enable signal at its enable input 26, the amplifier 22 is enabled and provides high impedance at its inputs 30 and 36 and a predetermined impedance at its output 42, while at the same time the amplifier 24, in the absence of an enable signal at its enable input 28, is disabled and provides high impedance at its inputs 32 and 38 and at its output 44. On the other hand, in response to an enable signal at its enable input 28, the amplifier 24 is enabled and provides low impedance at its inputs 32 and 38 and the predetermined impedance at its output 44, while at the same time the amplifier 22, in the absence of an enable signal at its enable input 26, is disabled and provides high impedance at its inputs 30 and 36 and at its output 44. When disabled by the absence of an enable signal, the amplifier 22 or 24 presents sufficiently high impedances at its input and output that for practical purposes it is as though the amplifier is out of the buffer circuit 20. A disabled amplifier therefore does not interfere with operation of an enabled amplifier. Consequently, the buffer circuit 20 is operable by application of an enable signal to the enable input to one or the other of the amplifiers 22 and 24 to selectively present either high or low impedance at the input nodes 34 and 40 and the predetermined impedance at the output node 46.

The buffer circuit 20 may be used between an integrated circuit (IC) and a load to accommodate driving an RF signal from the IC into the load, while providing isolation between the IC and the load. The IC driver applies the RF signal to the buffer input nodes 34 and 40 for delivery from the buffer output node 46 to the load, which load may be an ASIC. Depending upon the nature of the IC driver, an enable signal is applied to the enable input 26 or 28 of a selected one of the amplifiers 22 and 24, in accordance with whether the buffer input impedance is to be high or low. The other amplifier to which no enable signal is applied, is disabled by the absence of an enable signal, causing its input and output to be sufficiently high impedance that it does not affect operation of the enabled amplifier. This advantageously allows the inputs and the outputs of the amplifiers 22 and 24 to be tied directly together at the nodes 34, 40 and 46 without need for separate isolating circuits. The buffer circuit 20 is therefore selectively operable in a manner to provide a more robust and less parasitic dependent interface, and is generic since it can selectively provide either low or high input impedance while maintaining predetermined output impedance. Advantageously, the buffer is backward compatible since it can be operated to meet industry standard low or high impedance at its input, even if the industry standard may not be the best input impedance choice for robustness and parasitic insensitivity. Also, while the implementation of the invention shown in FIG. 1 utilizes two separate enable inputs 26 and 28, it is contemplated that if one or the other of the amplifiers is to always be enabled, a single enable input be used, in which case the enable signal would have two discrete different levels, one level for low and the other for high buffer circuit input impedance.

Figure 2A:
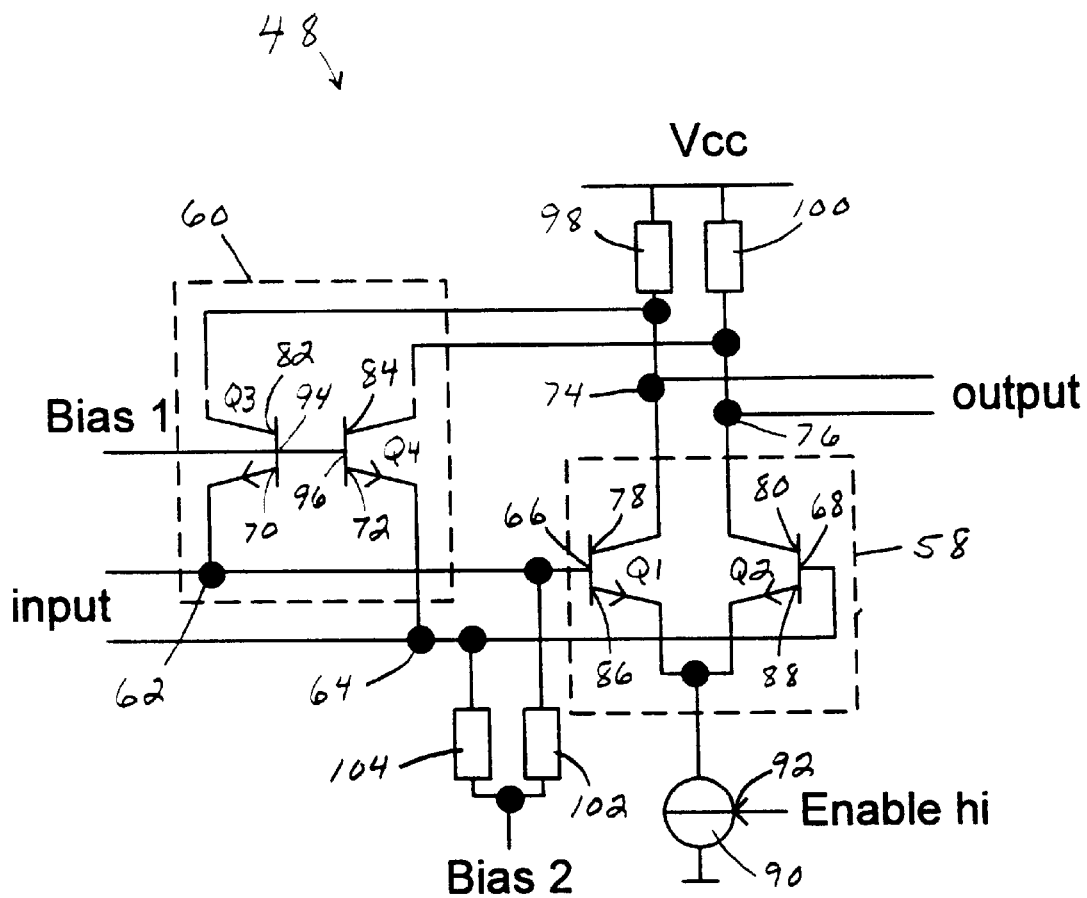
FIG. 2a is a schematic of a contemplated implementation of the buffer circuit of the invention.
Figure 2B:
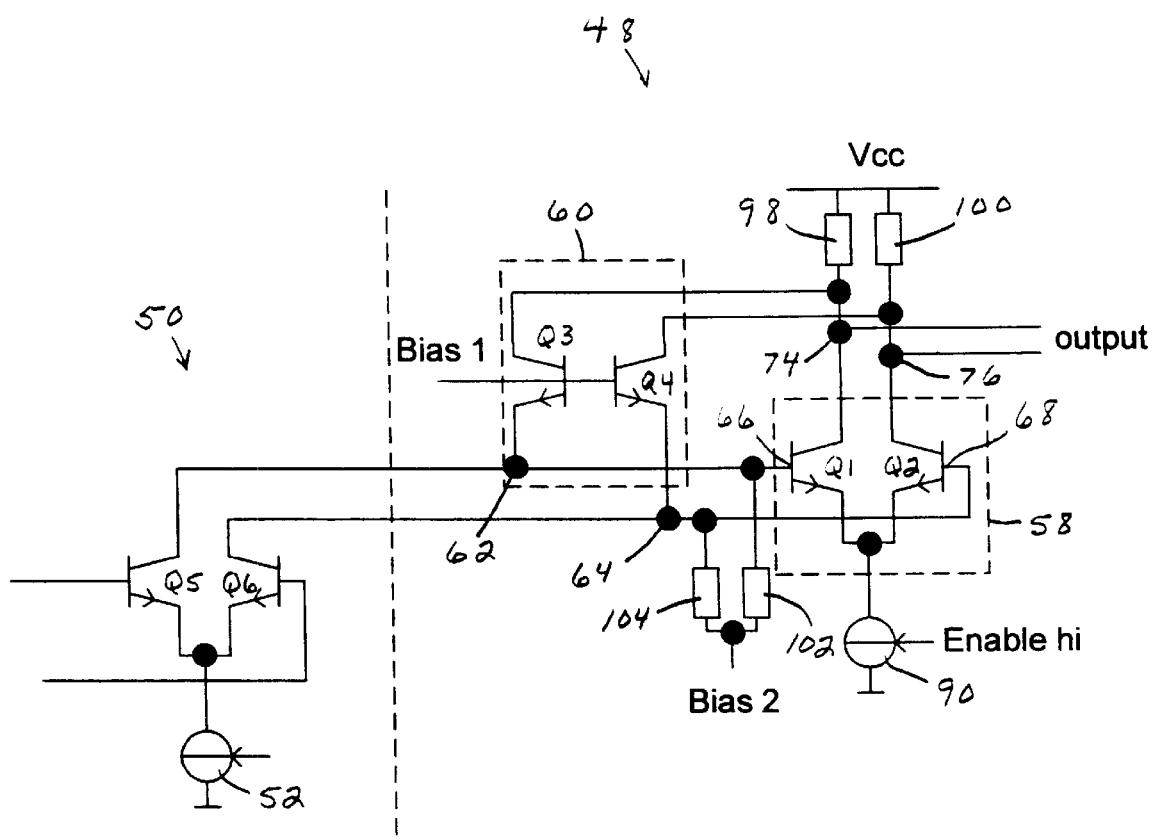
FIG. 2b is a schematic of the buffer circuit of FIG. 2a, connected to provide low impedance input to a driver circuit.
Figure 2C:
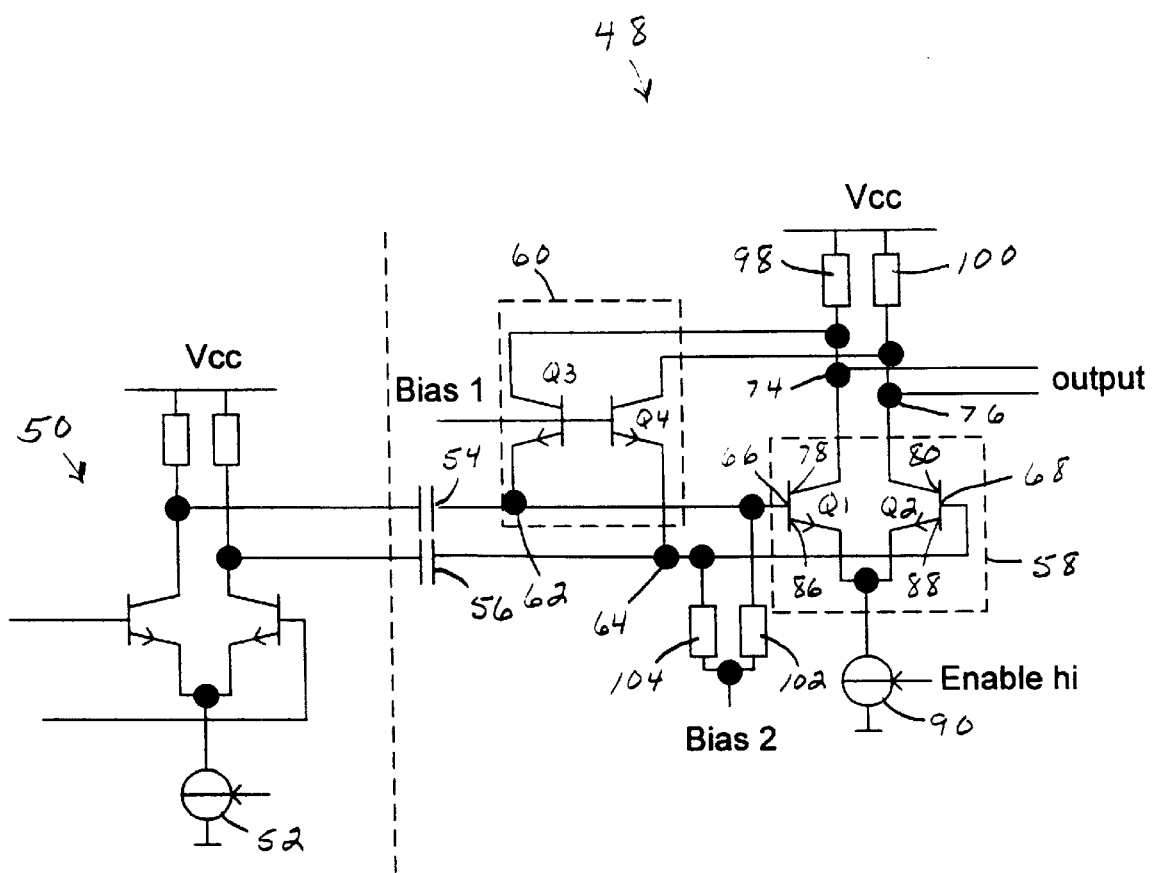
FIG. 2c is a schematic of the buffer circuit of FIG. 2a, connected to provide high impedance input to a driver circuit.

FIGS. 2a–2c show a contemplated implementation of a buffer circuit, indicated generally at 48. In FIG. 2a, the buffer circuit is shown standing alone. In FIGS. 2b–2c, the buffer is connected at its input to an IC driver output stage, indicated generally at 50, that includes a current source 52. In low input impedance mode the buffer has its input connected directly to the output from the driver stage, as shown in FIG. 2b. In high input impedance mode DC current is to be blocked from the input to the buffer, so the buffer input is coupled to the driver stage through a pair of capacitors 54 and 56, as shown in FIG. 2c.

The buffer circuit 48 includes a first amplifier 58 and a second amplifier 60 that respectively correspond to the amplifiers 22 and 24 in FIG. 1. The amplifier 58 may selectively be enabled, while the amplifier 60 is disabled, to provide high impedance at an input to the buffer, defined at a pair of input nodes 62 and 64. The amplifier 60, in turn, may selectively be enabled, while the amplifier 58 is disabled, to provide low impedance at the buffer input.

The amplifier 58 includes a bipolar junction transistor (BJT) Q1 and a BJT Q2, the amplifier 60 has BJTs Q3 and Q4, and the buffer circuit input nodes 62 and 64 connect to an output from the driver circuit 50. Bases or control elements 66 and 68 of respective BJTs Q1 and Q2 of the amplifier 58, and emitters or output elements 70 and 72 of respective BJTs Q3 and Q4 of the amplifier 60, connect to respective ones of the input nodes 62 and 64. Collectors or input elements 78 and 80 of respective BJTs Q1 and Q2 of the amplifier 58, and collectors or input elements 82 and 84 of respective BJTs Q3 and Q4 of the amplifier 60, connect to respective ones of a pair of output nodes 74 and 76. Emitters or output elements 86 and 88 of respective BJTs Q1 and Q2 are connected to a current source 90 that is selectively operable between off and on states under control of an enable signal at an enable input 92, and bases or control elements 94 and 96 of the BJTs Q3 and Q4 are connected to a bias 1 input. An operating power source Vcc is connected to the output nodes 74 and 76 through a pair of impedances 98 and 100, and a bias 2 input is connected to the input nodes 62 and 64 through relatively high value impedances 102 and 104. The buffer circuit 48 is operable to selectively have either low or high impedance at its input, i.e., across the input nodes 62 and 64, depending upon the relative enabled and disabled states of the amplifiers 58 and 60. The output impedance or output properties of the buffer across its output nodes 74 and 76 is determined by the values of the impedances 98 and 100, and remains constant irrespective of the relative enabled/disabled states of the amplifiers 58 and 60.

Figure 3:
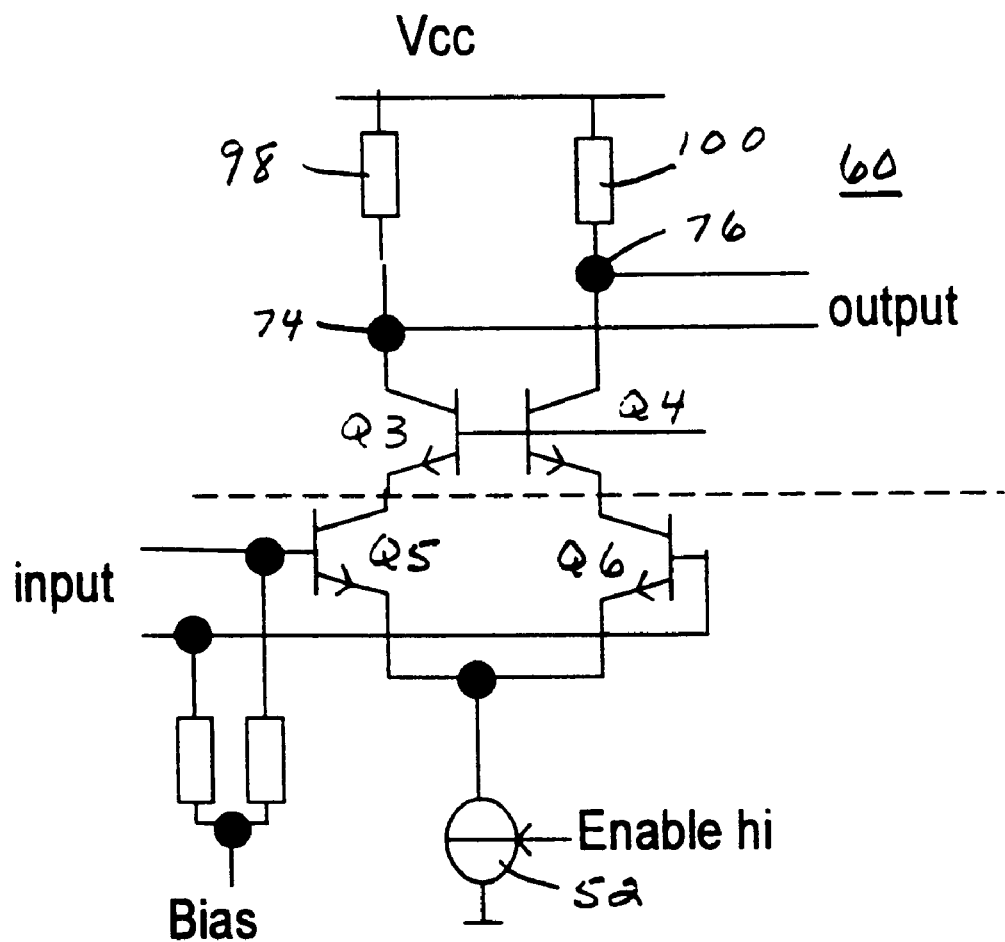
FIG. 3 shows the manner in which the buffer circuit and driver circuit of FIG. 2b form a differential pair with cascode in the low input impedance mode of the buffer circuit.

In operation of the buffer circuit 48 to have low impedance at the input nodes 62 and 64, the amplifier 60 is enabled and the amplifier 58 is disabled. With reference to FIGS. 2a and 2b, a control voltage is applied at the bias 1 input to the amplifier 60 and coupled to the control elements 94 and 96 of BJTs Q3 and Q4. The control voltage is of a value to forward bias the base-emitter junctions of the BJTs Q3 and Q4 and establish a current flow between the operating power source Vcc and the buffer circuit input nodes 62 and 64 and through the impedances 98 and 100, with the current being supplied by the current source 52 of the driver circuit. Under this condition, the amplifier 60 and the driver circuit together form a differential pair with cascode, as shown in FIG. 3, split at the dashed horizontal line to form a low impedance interface at the input nodes 62 and 64 to the buffer circuit. In FIG. 3, the amplifier 60 is above the dashed line, the driver circuit 50 is below the dashed line and a bias voltage is applied to bases or control elements of a pair of BJTs Q5 and Q6 of the driver circuit 50 to forward bias the base-emitter junctions of the BJTs for the flow of current between the current source 52 and the power source Vcc. In addition, an enable signal is removed from the enable input 92 to the current source 90, so that no current is available for flow through the BJTs Q1 and Q2, with the result that the amplifier 58 is disabled and the buffer operates as though the amplifier 58 were not present. The low impedance across the buffer circuit input nodes 62 and 64 is then provided by the low impedance presented by the forward biased base-emitter junctions of the BJTs Q3 and Q4.

Since the two bias impedances 102 and 104 are relatively high value, the voltage at the buffer circuit input nodes 62 and 64 is set by the bias 1 voltage, and is one diode voltage drop lower than the bias 1 voltage because of the base-emitter voltage drop through the BJTs Q3 and Q4. The voltage drop generated across the two impedances 98 and 100, from the current flow between the power source Vcc and the current source 52 and through the BJTs Q3 and Q4 of the amplifier circuit 60, then sets the DC voltage level at the buffer output nodes 74 and 76. This buffer output voltage is not dependent upon any current flow through the BJTs Q1 and Q2 of the amplifier 58, since under the condition of low buffer input impedance the current source 90 is off, no current flows through the BJTs Q1 and Q2, the BJTs Q1 and Q2 are high impedance and the amplifier 58 is disabled and has no effect upon the performance of the rest of the circuit. In addition, under the condition of low buffer input impedance, because the impedances 102 and 104 are relatively high value, a bias 2 voltage can be set at any proper value, which conveniently allows the bias 2 voltage to be left at a value as used in high buffer input impedance mode. The values of the impedances 98 and 100, across which the buffer output voltage is developed, determine the output properties of the buffer circuit and are selected in accordance with the input properties of the circuit to which the buffer output nodes 74 and 76 connect.

To operate the buffer circuit 48 to have high impedance at the input nodes 62 and 64, the amplifier 58 is enabled and the amplifier 60 is disabled. With reference to FIGS. 2a and 2c, the amplifier 60 is disabled by applying a control voltage to the control elements 94 and 96 of the BJTs Q3 and Q4, via the bias 1 input, of sufficiently low value to turn off the BJTs. The control voltage level is such that the voltage level at the control elements of the BJTs is preferably lower than the DC voltage level at the output elements 70 and 72 to reverse bias the base-emitter junctions of the BJTs Q3 and Q4. The BJTs Q3 and Q4 are therefore turned off and act as high impedance, and the buffer circuit then operates as though the amplifier 60 were not present.

To enable the amplifier 58 for high input impedance mode of the buffer circuit 48, the current source 90 is turned on by application of an enable signal at its enable input 92 and a control voltage is applied, or continues to be applied, at the bias 2 input. The control voltage level at the bias 2 input is a compromise. In high impedance mode, the BJTs Q1 and Q2 are forward biased to conduct a current flow between the power source Vcc and the current source 90 through the impedances 98 and 100 to generate the output bias voltage at the output nodes 74 and 76. The output voltage appears at the input elements or collectors 78 and 80 of the BJTs Q1 and Q2, and the bias 2 control voltage level must therefore be sufficiently low that the base-collector junctions of the BJTs Q1 and Q2 are not forward biased. On the other hand, the bias 2 control voltage level must not be too low, since the voltage level at the BJT output elements 86 and 88 also is set by the control voltage, and is a diode voltage drop lower than the control voltage at the BJT control elements 66 and 68. If the bias 2 control voltage level is too low, the total voltage drop across the current source 90 makes the buffer circuit high impedance mode difficult to implement. The high impedance at the input nodes 62 and 64 is then provided by the control elements or bases 66 and 68 of the BJTs Q1 and Q2.

Figure 4:
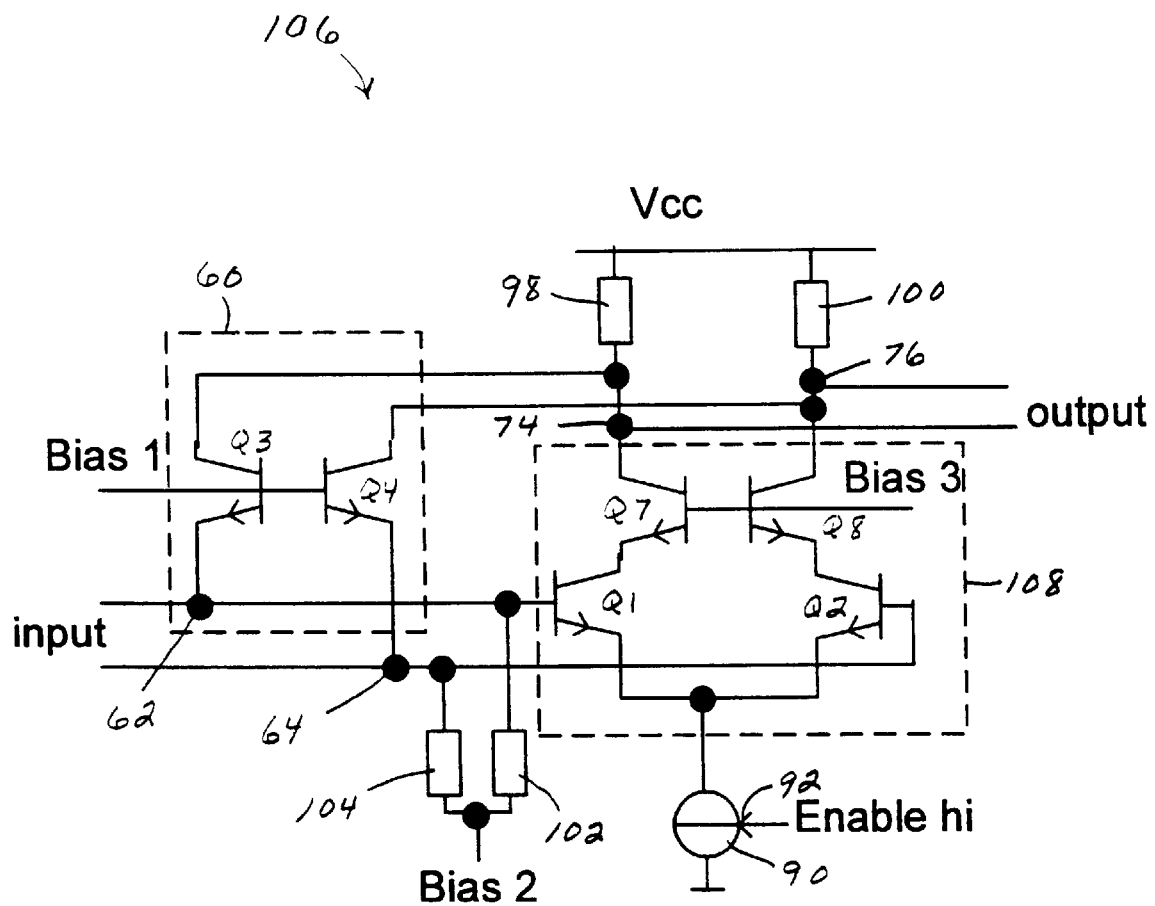
FIG. 4 shows the manner in which the buffer circuit and driver circuit of FIG. 2c form a differential pair with cascode in the high input impedance mode of the buffer circuit.

In the FIG. 4 embodiment of buffer circuit, indicated generally at 106, an amplifier 108 for providing high buffer input impedance is a cascode stage for good voltage gain and improved reverse isolation. The buffer circuit 106 differs from the buffer 48 of FIG. 2a in the inclusion of cascode BJTs Q7 and Q8, but otherwise is identical and like reference identifications have been used to denote like components. The amplifier 108 is, essentially, the amplifier 58 of FIG. 2a with the addition of cascode BJTs Q7 and Q8 between respective BJTs Q1 and Q2 and the output nodes 74 and 76. The buffer 106 operates in low and high input impedance mode as described in respect of FIGS. 2a, 2b and 2c, except that in high input impedance mode a bias 3 voltage is applied to control elements or bases of cascode BJTs Q7 and Q8 to forward bias the base-emitter junctions of the BJTs for flow of current between the power source Vcc and the current source 90 to generate an output bias voltage signal across the resistors 98 and 100 and at the output nodes 74 and 76. In addition, in low impedance mode when the amplifier 108 is disabled, the bias 3 voltage level is decreased to reverse bias the base-emitter junctions of the BJTs Q7 and Q8, so that the base-emitter voltage drop is lower than a diode voltage drop to make the BJTs high impedance.

Figure 5:
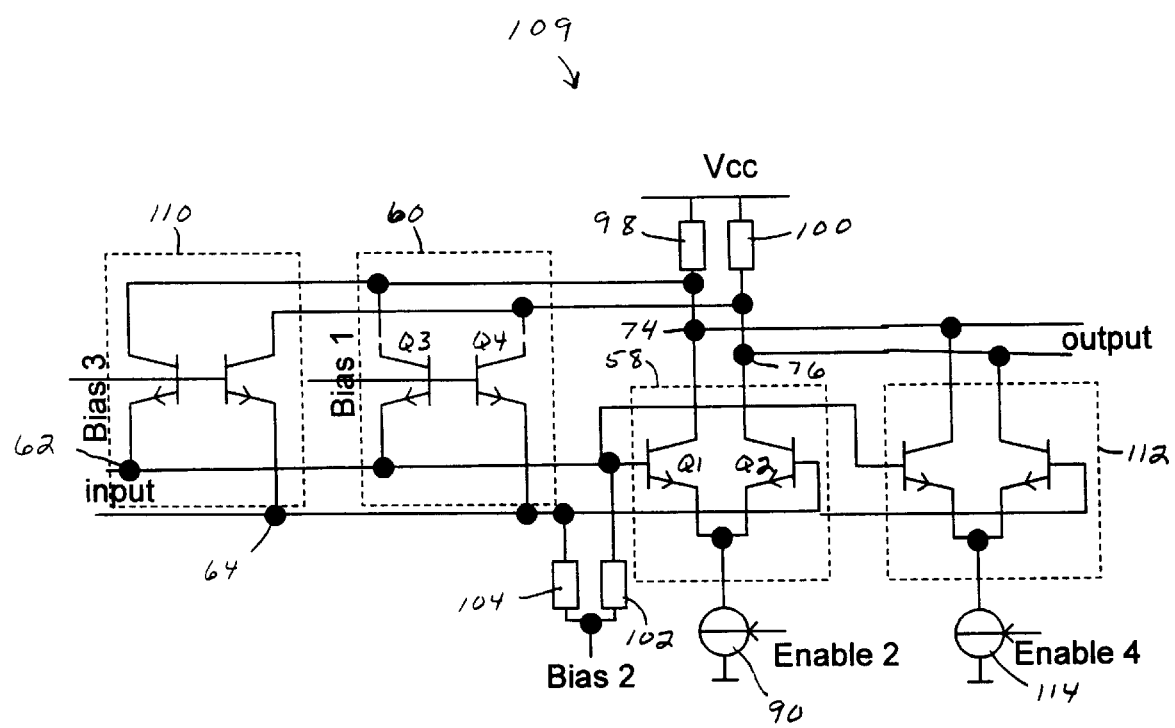
FIG. 5 is a schematic representation of a multi-stage embodiment of the buffer circuit.

FIG. 5 shows the manner in which any number of low and high input impedance stages or amplifiers may be used in an input buffer circuit configuration, indicated generally at 109. For example, in FIG. 5 the low and high input impedance amplifiers 60 and 58 are connected not only to each other in the same manner as in FIGS. 2a–2c, but also to additional low and high input impedance amplifiers 110 and 112. The low input impedance amplifier 110 is similar to the low input impedance amplifier 60, and has an input connected to the buffer circuit input ports 62 and 64 and an output connected to the buffer output ports 74 and 76. The high input impedance amplifier 112 is similar to the high input impedance amplifier 58, and has in input connected to the buffer circuit input ports 62 and 64 and an output connected to the buffer output ports 74 and 76. Each low input impedance amplifier 60 and 110 has an associated bias input bias 1 and bias 3, and each high impedance input amplifier 58 and 112 has an associated current source 90 and 114 with separate enable inputs.

To provide the buffer circuit 109 with low impedance at the input nodes 62 and 64, a control voltage is applied to one or both of the bias 1 and bias 3 inputs to forward bias the base-emitter junctions of BJTs of, and to enable one or both of, the low input impedance amplifiers 60 and 110. In addition, enable signals are removed from enable inputs to each of the current sources 90 and 114 to disable both of the high input impedance amplifiers 58 and 112. If high buffer input impedance is desired, then an enable signal is applied to the enable input to one or both of the current sources 90 and 114 to enable one or both of the high input impedance amplifiers 58 and 112. At the same time, the bias 1 and bias 3 control voltages are set to a level sufficiently low to reverse bias the base-emitter junctions of the BJTs of the amplifiers 60 and 110 to disable the amplifiers. An advantage of the multi-stage buffer circuit 109 is that since the high and the low input impedance amplifiers connect in parallel, they can be individually enabled and disabled to provide additional control over the magnitude of the buffer input impedance. One or both of the high input impedance amplifiers 58 and 112 may be selectively enabled to provide two different high buffer input impedances, and one or both of the low input impedance amplifiers 60 and 110 may be selectively enabled to provide two different low buffer input impedances.

While embodiments of the invention have been described in detail, one skilled in the art may devise various modifications and other embodiments thereof without departing from the spirit and scope of the invention, as defined in the appended claims.

We claim:

1. A multi-impedance input buffer circuit for driving a signal from a source to a load, comprising:

at least one amplifier circuit having an input for receiving the signal from the source and an output for delivering the signal to the load, said at least one amplifier being responsive to a first control signal to have low input impedance while said at least one amplifier is coupling the signal from the source to the load and being responsive to a second control signal to have high input impedance while said at least one amplifier is coupling the signal from the source to the load.

2. A multi-impedance input buffer circuit as in claim 1, wherein said at least one amplifier circuit has generally the same output impedance, while coupling the signal from the source to the load, irrespective of whether said at least one amplifier has low or high input impedance.

3. A multi-impedance input buffer as in claim 1, wherein said at least one amplifier circuit comprises first and second amplifier circuits.

4. A multi-impedance input buffer circuit as in claim 1, wherein said at least one amplifier circuit comprises:

a first amplifier circuit for delivering the signal from the source to the load, said first amplifier circuit having an input for receiving the signal from the source, an output for delivering the signal to the load, and an impedance control, said first amplifier being responsive to application of said first control signal at its impedance control to be enabled to couple the signal from the source to the load and to have low input impedance, and being responsive to absence of said first control signal at its impedance control to be disabled from coupling the signal from the source to the load and to have high input impedance, and a second amplifier circuit for coupling the signal from the source to the load, said second amplifier circuit having an input connected to said first amplifier circuit input for receiving the signal from the source, an output connected to said first amplifier circuit output for delivering the signal to the load, and an impedance control, said second amplifier circuit being responsive to application of a second control signal at its impedance control to be enabled to couple the signal from the source to the load and to have high input impedance, and being responsive to absence of said second control signal at its impedance control to be disabled from coupling the signal from the source to the load and to have high input impedance.

5. A multi-impedance input buffer circuit as in claim 4, wherein said first and second amplifier circuits, when disabled, have high output impedance, said first and second amplifier circuit outputs couple to an output from said buffer circuit, and including at least one impedance at said buffer circuit output for providing a constant buffer output impedance irrespective of the enabled/disabled states of said first and second amplifiers.

6. A multi-impedance input buffer circuit as in claim 4, wherein each of said first and second amplifier circuits, when disabled, has sufficiently high input and output impedance that when one of said first and second amplifier circuits is enabled while said other amplifier circuit is disabled, the disabled amplifier circuit does not affect operation of the enabled amplifier circuit.

7. A multi-impedance input buffer circuit as in claim 4, wherein only one or the other of said first and second control signals is applied at any one time to its respective impedance control.

8. A multi-impedance input buffer circuit as in claim 4, wherein said input buffer circuit has input nodes for receiving the signal from the source and output nodes for coupling the signal to the load, each said first and second amplifier circuit input is coupled to said input nodes and each said first and second amplifier circuit output is coupled to said output nodes, and including at least one impedance coupled to said output nodes for providing a constant buffer output impedance irrespective of the enabled/disables states of said first and second amplifiers.

9. A multi-impedance input buffer circuit as in claim 4, wherein at least one of said first and second amplifiers is a cascode stage.

10. A multi-impedance input buffer circuit as in claim 4, wherein each of said first and second amplifiers is a cascode stage.

11. A multi-impedance input buffer circuit for driving a signal from a source to a load, said buffer circuit having input nodes for receiving the signal from the source and output nodes for delivering the signal to the load and comprising:

a first amplifier circuit having an input connected to said input nodes, an output connected to said output nodes, and an impedance control, said first amplifier circuit being responsive to application of a first control signal at its impedance control to be enabled to couple the signal from said input nodes to said output nodes and to have low input impedance, and being responsive to absence of said first control signal at its impedance control to be disabled from coupling the signal from the source to the load and to have high input and output impedance, and a second amplifier circuit having an input connected to said input nodes, an output connected to said output nodes, and an impedance control, said second amplifier circuit being responsive to application of a second control signal at its impedance control to be enabled to couple the signal from said input nodes to said output nodes and to have high input impedance, and being responsive to absence of said second control signal at its impedance control to be disabled from coupling the signal from the source to the load and to have high input and output impedance.

12. A multi-impedance input buffer circuit as in claim 11, wherein said first and second amplifier circuits, when enabled, have generally the same output impedance.

13. A multi-impedance input buffer circuit as in claim 11, wherein each of said first and second amplifier circuits, when disabled, has sufficiently high input and output impedance that when one of said first and second amplifier circuits is enabled while said other amplifier circuit is disabled, said disabled amplifier circuit does not affect operation of said enabled amplifier circuit.

14. A multi-impedance input buffer circuit as in claim 11, wherein only one or the other of said first and second control signals is applied at any one time to its respective impedance control.

15. A multi-impedance input buffer circuit as in claim 11, further comprising:
   a plurality of said first amplifier circuits connected in parallel between said input nodes and said output nodes.

16. A multi-impedance input buffer circuit as in claim 11, further comprising:
   a plurality of said second amplifier circuits connected in parallel between said input nodes and said output nodes.

17. A multi-impedance input buffer circuit as in claim 11, further comprising:
   a plurality of said first amplifier circuits connected in parallel between said input nodes and said output nodes, and
   a plurality of said second amplifier circuits connected in parallel between said input nodes and said output nodes.

18. A multi-impedance input buffer circuit as in claim 11, wherein at least one of said first and second amplifiers is a cascode stage.

19. A multi-impedance input buffer circuit for driving a signal from a source to a load, said buffer circuit having two input nodes for receiving the signal from the source and two output nodes for delivering the signal to the load, said buffer circuit comprising:
   a first amplifier circuit including two transistors, each having an output element coupled to a respective one of said input nodes, an input element coupled to a respective one of said output nodes, and a control element coupled to a first bias signal input;
   a current source actuable between off and on states;
   a second amplifier circuit including two transistors, each having an output element coupled to said current source, an input element coupled to a respective one of said output nodes, and a control element coupled to a respective one of said input nodes;
   an operating power supply connected through two output signal generating impedances to respective ones of said output nodes; and
   a pair of bias impedances connected between respective ones of said input nodes and a second bias signal input,
   said buffer circuit being operable to provide low impedance at said input nodes, and to generate the signal from the source at said output nodes, in response to a first bias signal at said first bias input, a second bias signal at said second bias input and said current source being actuated to said off state, and
   said buffer circuit being operable to provide high impedance at said input nodes, and to generate the signal from the source at said output nodes, in response to a third bias signal at said first bias input, a fourth bias signal at said second bias input and said current source being actuated to said on state.

20. A multi-impedance input buffer circuit as in claim 19, wherein said second and fourth bias signals are the same.

21. A multi-impedance input buffer circuit as in claim 19, wherein said transistors of said first and second amplifier circuits are each a bipolar junction transistor (BJT) having emitter, collector and base elements corresponding to said output, input and control elements.

22. A multi-impedance input buffer circuit as in claim 21, wherein said buffer circuit is operable to provide low impedance at said input nodes, and to generate the signal from the source at said output nodes, both in response to said current source being actuated to its off state so that no current flows through said BJTs of said second amplifier circuit and said second amplifier circuit is disabled, and also in response to said first bias signal being of a level to forward bias base-emitter junctions of said two BJTs of said first amplifier circuit for flow of current from said operating power supply to said input nodes through said output signal generating impedances and said first amplifier circuit BJTs to generate across said output signal generating impedances and at said output nodes the signal from the source.

23. A multi-impedance input buffer circuit as in claim 21, wherein said buffer circuit is operable to provide high impedance at said input nodes, and to generate the signal from the source at said output nodes, both in response to said first bias signal being of a level to reverse bias base-emitter junctions of said first amplifier circuit BJTs so that no current flows through said BJTs and said first amplifier circuit is disabled, and also in response to said current source being actuated to its on state and said second bias signal being of a level to forward bias base-emitter junctions of said second amplifier circuit BJTs for flow of current from said operating power supply to said input nodes through output signal generating impedances and said BJTs to generate across said output signal generating impedances and at said output nodes the signal from the source.

24. A multi-impedance input buffer circuit as in claim 21, wherein said buffer circuit is operable to provide low impedance at said input nodes, and to generate the signal from the source at said output nodes, both in response to said current source being actuated to its off state so that no current flows through the BJTs of said second amplifier circuit and said second amplifier circuit is disabled, and also in response to said first bias signal being of a level to forward bias base-emitter junctions of said first amplifier circuit BJTs for flow of current from said operating power supply to said input nodes through said output signal generating impedances and said BJTs to generate across said output signal generating impedances and at said output nodes the signal from the source, and
   wherein said buffer circuit is operable to provide high impedance at said input nodes, and to generate the signal from the source at said output nodes, both in response to said first bias signal being of a level to reverse bias said base emitter junctions of said first amplifier circuit BJTs so that no current flows through said BJTs and said first amplifier circuit is disabled, and also in response to said current source being actuated to its on state and said second bias signal being of a level to forward bias base-emitterjunctions of said second amplifier circuit BJTs for flow of current from said operating power supply to said input nodes through said output signal generating impedances and said BJTs to generate across said output signal generating impedances and at said output nodes the signal from the source.

25. A multi-impedance input buffer circuit as in claim 24, wherein said first and second amplifier circuits, when enabled to respectively provide low and high impedance at said input nodes, provide generally the same impedance at said output nodes.

26. A multi-impedance input buffer circuit as in claim 24, wherein base-emitter junctions of said BJTs of a disabled amplifier circuit are reverse biased so that the disabled amplifier circuit does not affect operation of the enabled amplifier circuit.

27. A multi-impedance input buffer circuit as in claim 21, wherein at least one of said first and second amplifiers is a cascode stage.

28. A multi-impedance input buffer circuit as in claim 21, wherein each of said first and second amplifiers is a cascode stage.

29. A multi-impedance input buffer circuit as in claim 21, further comprising:

a plurality of said first amplifier circuits connected in parallel between said input nodes and said output nodes, and a plurality of said second amplifier circuits connected in parallel between said input nodes and said output nodes.

30. A method of operating a buffer circuit for driving a signal from a source to a load, comprising:

coupling the signal from the source to an input to the buffer circuit;

connecting the output from the buffer circuit to the load; and controlling the buffer circuit to have either low input impedance and determined output impedance or high input impedance and the selected output impedance.

31. A method as in claim 30, wherein the determined output impedance of the first amplifier circuit and the selected output impedance of the second amplifier circuit are the same.

32. A method of operating a buffer circuit for driving a signal from a source to a load, wherein the buffer circuit includes first and second amplifier circuits, comprising:

coupling an input to the first amplifier circuit to the source to receive the signal and an output from the first amplifier circuit to the load;

coupling an input to the second amplifier circuit to both the input to the first amplifier circuit and to the source to receive the signal, and an output from the second amplifier to both the output from the first amplifier and to the load;

and operating the first and second amplifier circuits to either: (1) control the first amplifier circuit to be enabled and have low input impedance and determined output impedance and the second amplifier circuit to be disabled and have high input and output impedance, or (2) control the second amplifier to be enabled and have high input impedance and selected output impedance and the first amplifier circuit to be disabled and have high input and output impedance.

33. A method as in claim 32, wherein the determined output impedance of the first amplifier circuit and the selected output impedance of the second amplifier circuit are generally the same.

34. A method as in claim 32, wherein each of the first and second amplifier circuits, when disabled, has sufficiently high input and output impedance that it does not affect operation of the enabled amplifier circuit.

35. A method as in claim 32, wherein only one or the other of the first and second amplifier circuits is enabled at any one time, and when one amplifier circuit is enabled, the other amplifier circuit is disabled.

\* \* \* \* \*